United States Patent
McLaughlin et al.

(10) Patent No.: US 7,483,796 B2
(45) Date of Patent: Jan. 27, 2009

(54) METHOD AND APPARATUS FOR DETERMINING FAULTS IN AN ELECTRIC ASSIST STEERING SYSTEM

(75) Inventors: Kevin M. McLaughlin, Troy, MI (US); Joseph D. Miller, Farmington Hills, MI (US)

(73) Assignee: TRW Automotive U.S. LLC, Livonia, MI (US)

( * ) Notice: Subject to any disclaimer, the term of this patent is extended or adjusted under 35 U.S.C. 154(b) by 0 days.

(21) Appl. No.: 11/007,520

(22) Filed: Dec. 8, 2004

(65) Prior Publication Data
US 2006/0122796 A1   Jun. 8, 2006

(51) Int. Cl.
*G01R 31/00* (2006.01)
(52) U.S. Cl. ...................................... 702/58
(58) Field of Classification Search ............... 702/58; 318/138, 254, 434, 400.36; 701/41; 400/70; 320/123; 363/40; 361/23
See application file for complete search history.

(56) References Cited

U.S. PATENT DOCUMENTS

| | | | | |
|---|---|---|---|---|
| 4,035,700 A | * | 7/1977 | Kawasaki et al. | ........... 318/138 |
| 4,412,169 A | * | 10/1983 | Dell'Orto | .................. 320/123 |
| 4,529,325 A | * | 7/1985 | Moon | ........................... 400/70 |
| 4,972,133 A | | 11/1990 | Hirota et al. | |
| 4,984,647 A | | 1/1991 | Morishita et al. | |
| 5,303,156 A | | 4/1994 | Matsuoka et al. | |
| 5,574,346 A | * | 11/1996 | Chavan et al. | ............... 318/434 |
| 5,831,842 A | * | 11/1998 | Ogasawara et al. | ........... 363/40 |
| 5,889,376 A | | 3/1999 | Takatsuka et al. | |
| 6,107,767 A | | 8/2000 | Lu et al. | |
| 6,194,849 B1 | | 2/2001 | Wilson-Jones et al. | |
| 6,266,591 B1 | | 7/2001 | Wilson-Jones et al. | |
| 6,271,637 B1 | | 8/2001 | Kushion | |
| 2003/0141833 A1 | * | 7/2003 | Heidrich | ..................... 318/254 |
| 2005/0125124 A1 | * | 6/2005 | Nagase et al. | .................. 701/41 |
| 2006/0061923 A1 | * | 3/2006 | Wang et al. | .................... 361/23 |

* cited by examiner

*Primary Examiner*—Tung S Lau
*Assistant Examiner*—Xiuquin Sun
(74) *Attorney, Agent, or Firm*—Tarolli, Sundheim, Covell & Tummino LLP

(57) ABSTRACT

A method and apparatus for determining a fault in an electric motor (50) determines a calculated star voltage ($V_{star\_calc}$) of the electric motor. The calculated star voltage ($V_{star\_calc}$) is compared to a measured star voltage ($V_{star\_meas}$) of the electric motor (50) to determine a star voltage error ($V_{star\_err}$). The fault in the electric motor (50) is determined when the star voltage error ($V_{star\_err}$) exceeds a predetermined maximum star voltage error ($V_{star\_err\_max}$).

6 Claims, 3 Drawing Sheets

METHOD AND APPARATUS FOR DETERMINING FAULTS IN AN ELECTRIC ASSIST STEERING SYSTEM

TECHNICAL FIELD

The present invention relates to a method and apparatus for determining faults in an electric motor and in a system including an electric motor and means for controlling the motor. More particularly, in an exemplary embodiment, the present invention relates to a method and apparatus for determining faults in an electric assist steering system.

BACKGROUND OF THE INVENTION

Electric assist steering systems are known in the art. In electric assist steering systems, an electric assist motor, when energized, provides torque assist to aid the driver in turning steerable wheels of the vehicle. The electric assist motor is typically controlled in response to steering torque applied to the vehicle steering wheel and measured vehicle speed.

A controller monitors applied steering torque and vehicle speed and controls a drive circuit to control electric current applied to the electric assist motor. A drive circuit in an electric assist steering system may include field effect transistors ("FETs") or other forms of solid state switching devices operatively coupled between the vehicle battery and the electric assist motor. Motor current may be controlled by pulse-width-modulation ("PWM") of the FETs or switches.

An electric assist steering system may include a permanent magnet alternating current (PMAC) motor. One particular type of PMAC motor is a three-phase PMAC motor. In a three-phase PMAC motor, the FETs of the drive circuit are connected to provide three-phase voltage to the phases (A, B, C) of the motor. The phases (A, B, C) of the PMAC motor are connected at a common connection point referred to as the "star" of the motor. In operation of the three-phase PMAC motor, the A, B, and C phases of the motor are maintained 120 degrees (electrical) apart. For example, if phase A is at $\theta$ degrees, then phase B would be at $(\theta+120)$ degrees, and phase C would be at $(\theta-120)$ degrees.

In operation, the amount of torque produced by the PMAC motor is functionally related to the amplitude of the electric current in the phases of the motor. The frequency of the electric current in the phases of the PMAC motor is selected to create a magnetic field in the phase windings that rotates about the armature at a predetermined speed. The rotating magnetic field induces the rotor to rotate. The rotational speed of the rotor is thus determined by the frequency of the electric current in the phases of the PMAC motor.

In operation, the rotating magnetic field may be commanded to lead the rotor by some angle. The angle between the rotating magnetic field and the rotor is referred to as an advance angle. The advance angle of the electric current in the phases of the PMAC motor can be controlled by adjusting the phase angle of the current supplied to the windings. Typically, when controlling a PMAC motor, the advance angle is increased as the rotor speed increases.

During operation, a motor may experience what are commonly referred to as "motor faults." Motor faults may occur as a result of a variety of physical or structural failures of the motor. For example, in a PMAC motor, motor faults may occur when there is a short in a motor phase, when there is a phase-to-phase short in the motor phases, or when there is an open in a motor phase. Motor faults may cause the electric current realized in the motor phases to be different than the current commanded to the phases. As a result, the motor may not achieve the desired rotational speed or provide the desired torque.

Also, during operation, faults may occur in the FET driver circuit or in a controller, such as an electronic control unit ("ECU"), that is used to control operation of the FET driver circuit in order to control the motor. Such faults in the FET driver circuit or in the ECU may also cause the electric current realized in the motor phases to be different than the current commanded to the phases.

SUMMARY OF THE INVENTION

In accordance with the present invention, a method for determining a fault in an electric motor includes the step of determining a calculated star voltage of the electric motor. Next, the calculated star voltage is compared to a measured star voltage of the electric motor to determine a star voltage error. A fault in the electric motor is determined when the star voltage error exceeds a predetermined maximum star voltage error.

The average phase voltages are the mean of the PWM commands over any PWM cycle. The measurement of the star voltage may include a phase delay due to filtering, anti-aliasing, sampling, or a combination thereof. An equivalent delay can be added to the calculated star voltage by means of digital filtering.

Also, in accordance with the present invention, an apparatus for determining a fault in an electric motor includes a circuit for determining a calculated star voltage of the electric motor. The apparatus also includes a circuit for comparing the calculated star voltage to a measured star voltage of the electric motor to determine a star voltage error. The apparatus determines a fault in the electric motor when the star voltage error exceeds a predetermined maximum star voltage error.

BRIEF DESCRIPTION OF THE DRAWINGS

The foregoing and other features and advantages of the present invention will become apparent to those skilled in the art to which the present invention relates upon reading the following description with reference to the accompanying drawings, wherein.

DESCRIPTION OF AN EXEMPLARY EMBODIMENT

The present invention relates to an apparatus including an electric motor and means for controlling the electric motor. According to an exemplary embodiment of the present invention, the apparatus comprises an electric assist steering system 10. It will be appreciated, however, that the method and apparatus of the present invention may apply to a variety of systems that include electric motors and means for controlling the motors, such as machine tools.

Figure 1:
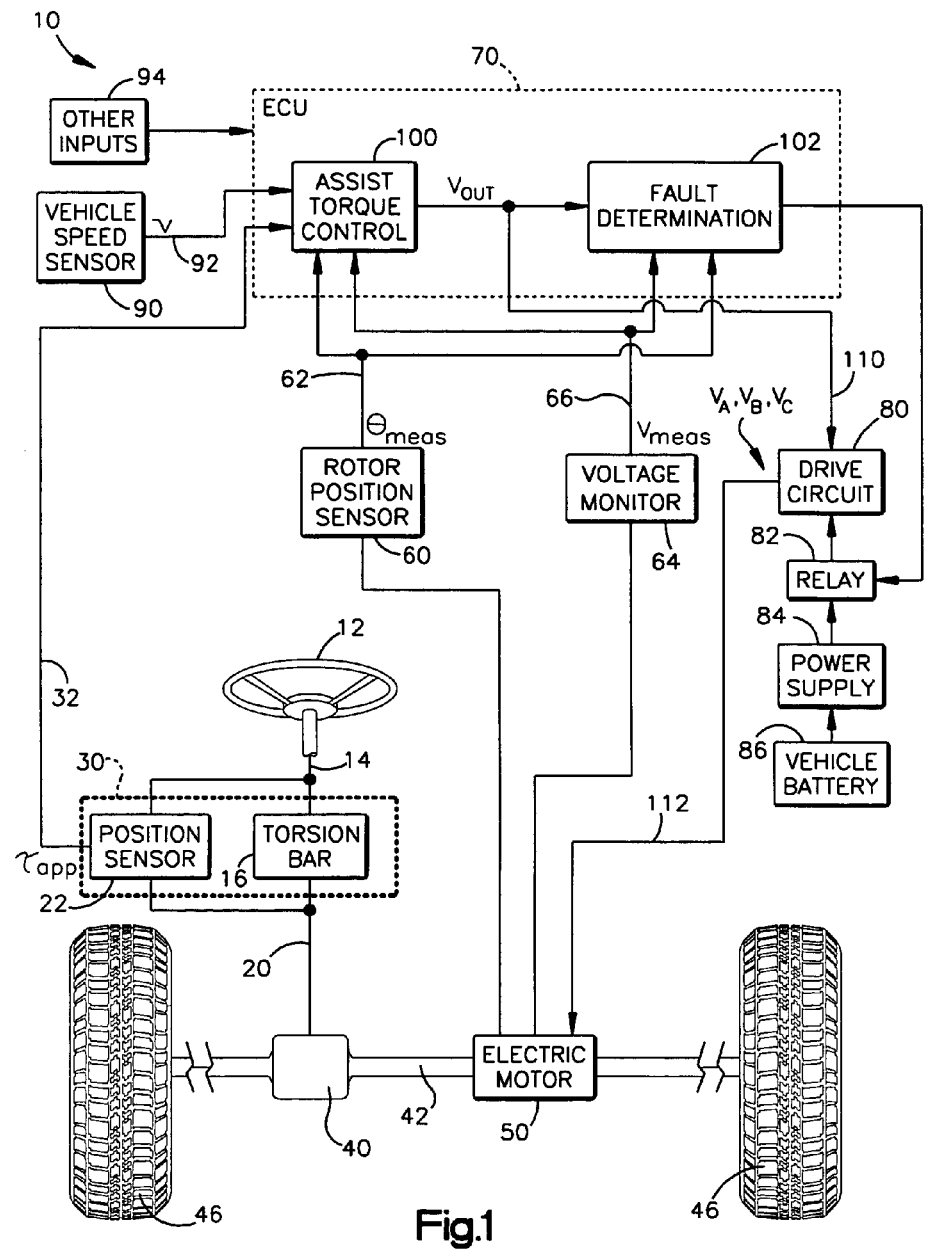
FIG. 1 is a schematic representation of an electric assist steering system in accordance with an exemplary embodiment of the present invention.

Referring to FIG. 1, the electric assist steering system 10 includes a steering wheel 12 connected to an input shaft 14. The input shaft 14 is connected to an output shaft 20 by a torsion bar 16. A position sensor 22 is operatively connected to the input shaft 14 and to the output shaft 20. The position sensor 22 senses the relative rotational position between the input shaft 14 and the output shaft 20. Taking into account the torsion strength of the torsion bar 16, this sensed relative rotational position between the input shaft 14 and the output shaft 22 is indicative of the amount of steering torque applied to the steering wheel 12. Thus, the combination of the position sensor 22 and the torsion bar 16 function together as a torque sensor 30. It will be appreciated that the torque sensor 30 may have alternative configurations. The torque sensor 30 provides a sensed applied torque signal $\tau_{app}$, indicated at 32, having a value indicative of the amount of steering torque applied to the steering wheel 12.

The output shaft 20 is connected to a pinion gear (not shown) of a rack and pinion gear set 40. The rack and pinion gear set 40 functions to transform the rotational motion of the steering wheel 12 into linear motion of a steering rack 42. The steering rack 42 is steerably connected to steerable wheels 46 of the vehicle in a manner well known in the art. The linear movement of the steering rack 42 steers the wheels 46 of the vehicle.

In accordance with the described exemplary embodiment of the present invention, an electric assist motor 50 is operatively connected to the steering rack 42 through a ball nut assembly (not shown) in a manner known in the art. The present invention is also applicable to steering assist arrangements such as column drive systems, pinion drive systems, etc. When the electric assist motor 50 is energized, the rotor turns which, in turn, rotates the nut portion of the ball nut assembly. When the nut rotates, the balls transfer a linear force to the steering rack 42. The direction of movement of the steering rack 42 is dependent upon the direction of rotation of the electric assist motor 50.

The electric assist motor 50 of the exemplary embodiment is preferably a permanent magnet alternating current (PMAC) motor. It will be appreciated, however, that the present invention may be applicable to various other types of electric motors that have a plurality of phases connected at a star connection point.

A PMAC motor operates in a known manner. Basically, the phases (A, B, C) in the stator (not shown) of the PMAC motor are energized with an amount of electric current in a sequence that is predetermined in order to achieve a desired motor torque in a desired rotational direction. The direction in which the rotor rotates is controlled by the sequence in which the phases are energized. The torque produced by the motor is determined by the amplitude of the current directed through the phases. The rotational speed of the motor is determined by the frequency of the current directed through the phases.

A rotor position sensor 60 is operatively connected to the electric assist motor 50 and senses the position of the motor rotor (not shown) relative to the motor stator. The position sensor 60 provides a rotor position signal θ, indicated at 62, having a value indicative of the relative position between the rotor and the stator. The structure and operation of a rotor position sensor for use with a PMAC motor is known in the art and, therefore, is not described herein in detail. Any of several known position sensors can be used.

A voltage monitoring device 64 is operatively connected to the electric assist motor 50 and monitors voltages of the motor. The voltage monitoring device 64 provides a measured voltage signal $V_{meas}$, indicated at 66. The measured voltage signal $V_{meas}$ includes a measured star voltage $V_{star\_meas}$ of the electric assist motor 50. The star voltage of the electric assist motor 50 will be discussed below. The measured voltage signal $V_{meas}$ may also include measured phase voltages ($V_A$, $V_B$, $V_C$) and/or line voltages ($V_{AB}$, $V_{BC}$, $V_{CA}$) of the electric assist motor 50.

The electric assist steering system 10 includes an electronic control unit ("ECU") 70. The ECU 70 is preferably a microcomputer having memory means such as internal ROM and/or RAM. The ECU 70 is operatively connected to a drive circuit 80. The drive circuit 80 is connected to a power supply 84 via a relay 82. The power supply 84 conditions electrical power received from a vehicle battery 86 and supplies the conditioned electrical power to the drive circuit 80.

The ECU 70 is also operatively connected to the rotor position sensor 60 and the voltage monitor 64 and receives the rotor position θ and the measured voltage $V_{meas}$, respectively. A vehicle speed sensor 90 provides a vehicle speed signal v, indicated at 92, to the ECU 70. Other inputs, indicated generally at 94, may also be provided to the ECU 70 for control, safety, or system monitoring purposes.

In this description of exemplary embodiments, the use of the word "circuit" and "function" are used interchangeably to describe functions performed within devices such as the ECU 70, controllers, computers, etc. Alternatively, these functions could be performed using discrete circuitry. In the exemplary embodiment of the present invention, the ECU 70 includes a motor control circuit 100 and a fault determination circuit 102.

In the electric assist steering system 10 of the exemplary embodiment, the motor control circuit 100 is operative to determine a required amount of steering assist torque as a function of the sensed applied steering torque $\tau_{app}$ and the vehicle speed v. The motor control circuit 100 also determines the average phase voltages ($V_A$, $V_B$, $V_C$) to be applied to the respective phases of the electric assist motor 50 such that the motor provides the determined required amount of steering assist torque. The average phase voltages ($V_A$, $V_B$, $V_C$) are determined as a function of the determined required steering assist torque and the sensed rotor position θ. The determined phase voltages ($V_A$, $V_B$, $V_C$) are packaged in a motor voltage command $V_{out}$, indicated at 110, which is provided to the fault determination circuit 102 and the drive circuit 80.

The ECU 70 may incorporate any of a variety of methods for determining the required steering assist torque and the motor voltage command $V_{out}$. For example, the ECU 70 may determine these values using curve functions, equations, or by selecting the values from a look-up table. Since a look-up table would contain only discrete values, interpolation techniques may be used to determine the required steering assist torque and/or the motor voltage command $V_{out}$.

The ECU 70 provides the motor voltage command $V_{out}$ to the drive circuit 80. The drive circuit 80 includes field effect transistors ("FETs") or other suitable switching devices that are operative to provide voltage ($V_A$, $V_B$, $V_C$), indicated at 112, to the phases (A, B, C) of the electric assist motor 50. The amplitude and frequency of the voltage ($V_A$, $V_B$, $V_C$) for each phase is controlled by pulse-width-modulation ("PWM") of the FETs. The motor voltage command $V_{out}$ is formatted such that the FETs provide the voltage ($V_A$, $V_B$, $V_C$) at the required amplitude and frequency.

Figure 2:
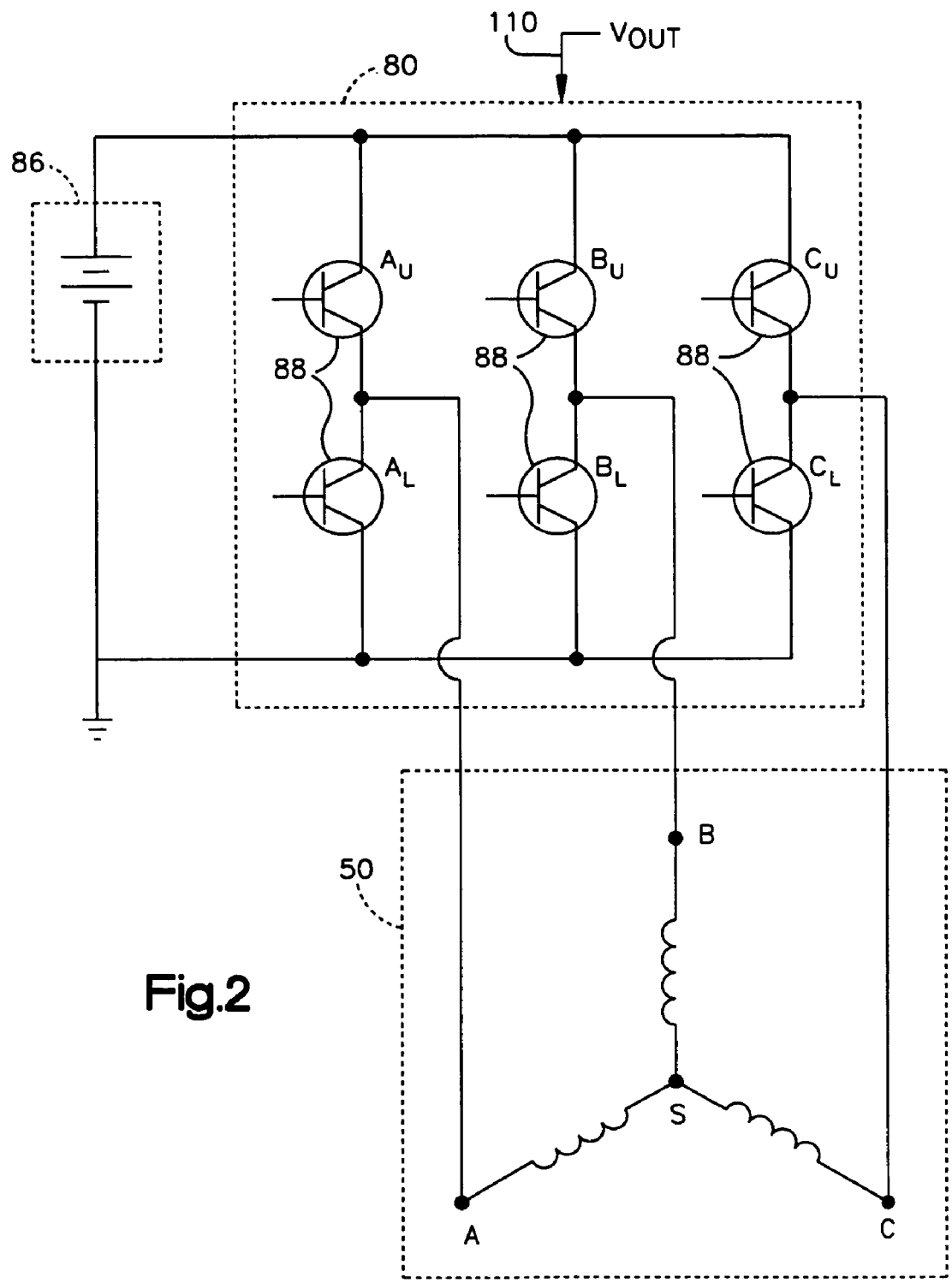
FIG. 2 is a schematic representation of a portion of the electric assist steering system of FIG. 1.

By way of example, FIG. 2 illustrates schematically the electric assist motor 50, drive circuit 80, and vehicle battery 86 of the electric assist steering system 10. In FIG. 2, the relay 82 and power supply 84 have been omitted for clarity. Also for clarity, full battery voltage is depicted in FIG. 2 as full positive battery voltage and zero battery voltage is depicted as battery ground, indicated at GND. It will be appreciated, however, that the electric assist steering system 10 may be referenced differently. For example, the star connection point of the motor, indicated at "S" in FIG. 2, may be kept at 0.5 battery voltage. In this instance, the maximum voltage across a motor phase (A, B, C) relative to the star connection point S is either +0.5*(battery voltage) or −0.5*(battery voltage).

The illustrated drive circuit 80 includes six FETs 88. The FETs 88 include three upper FETs, indicated at $A_U$, $B_U$, and $C_U$, and three lower FETs, indicated at $A_L$, $B_L$, and $C_L$. The upper FETs $A_U$, $B_U$, and $C_U$ are electrically connected to full battery voltage (i.e., positive battery voltage in the configuration of FIG. 2) and the lower FETs $A_L$, $B_L$, and $C_L$ are electrically connected to zero battery voltage (i.e., ground in the configuration of FIG. 2).

The phases (A, B, C) of the electric assist motor 50 each are electrically connected between respective FET pairs, each of which including an upper FET and a lower FET. Phase A is electrically connected between FET pair $A_U$ and $A_L$. Upper FET $A_U$ switches full battery voltage to phase A, and lower FET $A_L$ switches zero battery voltage to phase A. Phase B is electrically connected between FET pair $B_U$ and $B_L$. Upper FET $B_U$ switches full battery voltage to phase B, and lower FET $B_L$ switches zero battery voltage to phase B. Phase C is electrically connected between FET pair $C_U$ and $C_L$. Upper FET $C_U$ switches full battery voltage to phase C, and lower FET $C_L$ switches zero battery voltage to phase C.

Each phase (A, B, C) of the electric assist motor 50 has a resistance (R) and inductance (L). In a perfectly balanced motor, the resistance (R) and inductance (L) are the same for phases A, B, and C. In the perfectly balanced motor, the star voltage $V_{star}$, i.e., the voltage measured from the star connection point S to ground GND, is equal to one-third (⅓) of the sum of the input phase voltages:

$$V_{star} = \frac{1}{3}(V_A + V_B + V_C) \quad (1)$$

Where $V_{star}$ is the star voltage of the electric assist motor 50 and $V_A$, $V_B$, and $V_C$ are the voltages across phases A, B, and C, respectively, measured from respective motor phase input terminals to ground. The motor phase input terminals are indicated at A, B, and C in FIG. 2.

In an unbalanced motor, i.e., where resistance (R) and inductance (L) vary from phase to phase, the star voltage $V_{star}$ varies from the value of Equation (1) as a function of the phase-to-phase impedance variation in the motor.

According to the present invention, the fault determination circuit 102 determines faults in the electric assist steering system 10. The determined faults may include motor faults in the electric assist motor 50, or faults in the ECU 70 and/or the FET drive circuit 80. The fault determination circuit 102 determines the faults by comparing a calculated star voltage $V_{star\_calc}$ to a measured star voltage $V_{star\_meas}$. According to the present invention, a fault condition is determined when the calculated star voltage $V_{star\_calc}$ differs from the measured star voltage $V_{star\_meas}$ to a predetermined degree.

In the exemplary embodiment, the fault determination circuit 102 determines the calculated star voltage $V_{star\_calc}$ according to Equation (1) as one-third of the sum of the commanded phase voltages ($V_A$, $V_B$, $V_C$) determined by the motor control circuit 100 (FIG. 1). The calculated star voltage $V_{star\_calc}$ is thus indicative of the star voltage expected at the electric assist motor 50 in response to the motor voltage command $V_{out}$. The measured star voltage $V_{star\_meas}$ is measured by the voltage monitor 64 and provided to the fault determination circuit 102.

Figure 3:
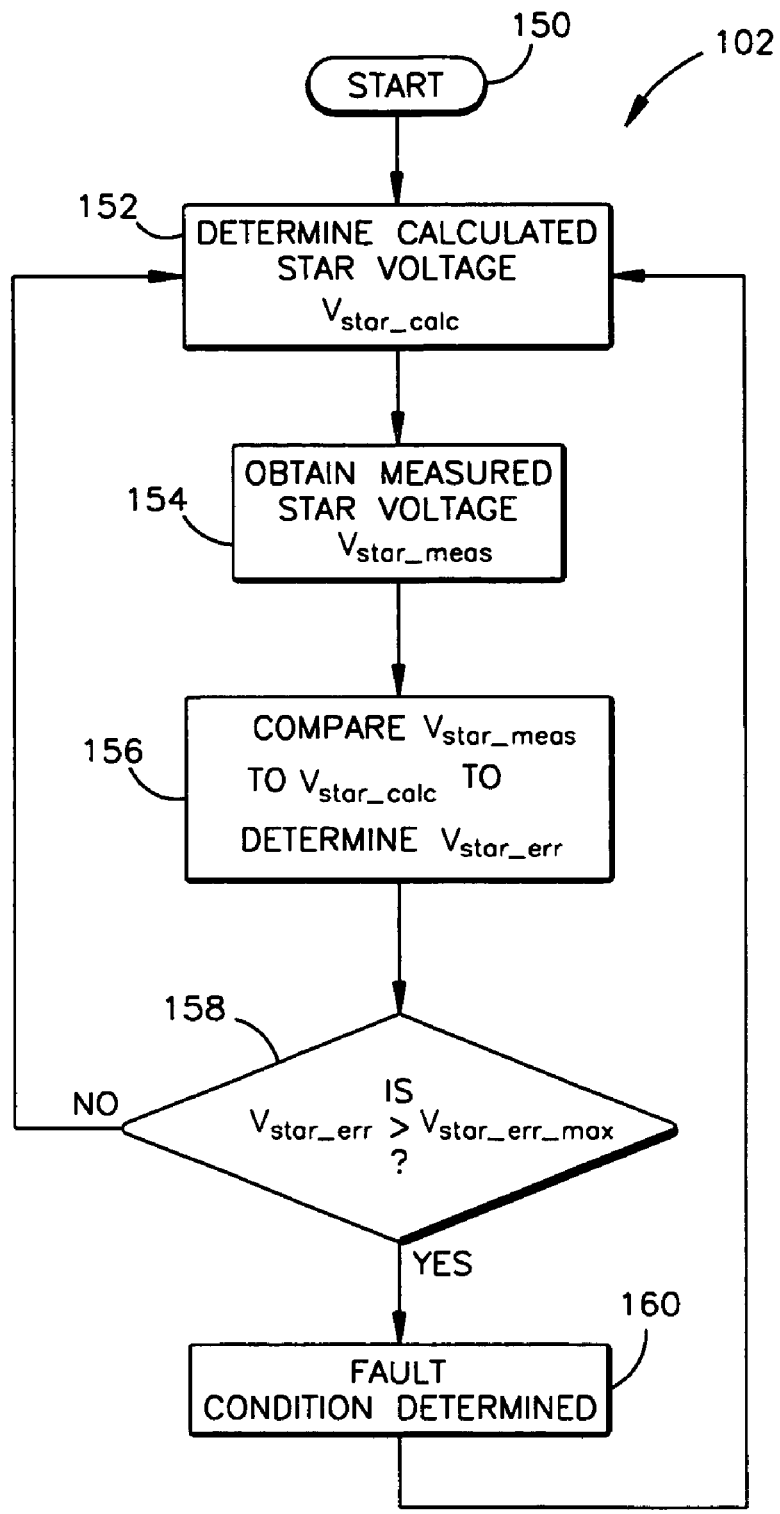
FIG. 3 is a functional block diagram of a fault determination circuit of the electric assist steering system of FIG. 1.

Referring to FIG. 3, the fault determination circuit 102 performs an algorithm for determining whether a fault condition exists in the electric assist steering system 10. The algorithm of the fault determination circuit 102 begins at step or function 150. At step or function 152, the calculated star voltage $V_{star\_calc}$ is determined according to Equation (1), i.e., as the one-third of sum of the phase voltages ($V_A$, $V_B$, $V_C$) packaged in the motor voltage command $V_{out}$. At step or function 154, the measured star voltage $V_{star\_meas}$ is obtained from the voltage monitor 64 (FIG. 1).

At step or function 156 (FIG. 3), the calculated star voltage $V_{star\_calc}$ is compared to the measured star voltage $V_{star\_meas}$ to determine a star voltage error $V_{star\_err}$. In the exemplary embodiment, the star voltage error $V_{star\_err}$ is determined as the absolute difference between the calculated star voltage $V_{star\_calc}$ and the measured star voltage $V_{star\_meas}$ as follows:

$$V_{star\_err} = |V_{star\_calc} - V_{star\_meas}| \quad (3)$$

At step or function 158, a determination is made as to whether the star voltage error $V_{star\_err}$ is greater than a predetermined maximum star voltage error $V_{star\_err\_max}$. If the star voltage error $V_{star\_err}$ exceeds the maximum star voltage error $V_{star\_err\_max}$, then a fault is determined at step or function 160 and the algorithm may begin another iteration at step or function 152. If the star voltage error $V_{star\_err}$ does not exceed the maximum star voltage error $V_{star\_err\_max}$, then the algorithm begins another iteration at step or function 152.

The algorithm performed by the fault determination circuit 102 is operative to determine a fault condition when the star voltage error $V_{star\_err}$ exceeds the maximum star voltage error $V_{star\_err\_max}$ for at least one iteration of the algorithm. The fault determination circuit 102 may indicate a fault condition upon a single iteration or a predetermined number of iterations of the algorithm where the star voltage error $V_{star\_err}$ exceeds the maximum star voltage error $V_{star\_err\_max}$. The predetermined number of iterations may be a successive number of iterations or a cumulative number of iterations.

As stated above, a fault determined by the fault determination circuit 102 may be a fault in the electric assist motor 50, the ECU 70, or the FET drive circuit 80. For example, in the electric assist motor 50, a short or open in a phase winding or a phase-to-phase short may result in a star voltage error $V_{star\_err}$ that exceeds the maximum star voltage error $V_{star\_err\_max}$. A short in the ECU 70 may result in a star voltage error $V_{star\_err}$ that exceeds the maximum star voltage error $V_{star\_err\_max}$. A short in the FET drive circuit 80 or the failure of a FET 88 may result in a star voltage error $V_{star\_err}$ that exceeds the maximum star voltage error $V_{star\_err\_max}$. In fact, it will be appreciated that the fault determination circuit 102 of the exemplary embodiment would detect any fault condition wherein the star voltage error $V_{star\_err}$ exceeds the maximum star voltage error $V_{star\_err\_max}$.

Once a fault condition is determined by the fault determination circuit 102, the electric assist steering system 10 may be operative to provide a variety of responsive actions. For example, as illustrated in FIG. 1, the fault determination circuit 102 may be operatively connected to the relay 82. The fault determination circuit 102 thus may be operative to open the relay 82 in the event of a fault in order to disable the electric assist motor 50. Alternatively, the fault determination circuit 102 may be operative to provide an audible and/or visual indication or alarm upon determination of a fault condition in the electric assist motor 50 the fault determination may disable all FET drivers.

The present invention thus helps monitor for faults in the electric assist steering system 10. The present invention also helps provide assurance that the PWM commands are successfully applied to the electric assist motor 50. Advantageously, the apparatus and method of the present invention determine faults in the electric assist steering system 10 without requiring direct measurement of the phase voltages ($V_A$, $V_B$, $V_C$).

From the above description of the invention, those skilled in the art will perceive improvements, changes and modifica- Having described the invention, the following is claimed:

1. A method for determining a fault in a system including an electric motor, said method comprising the steps of:
   determining a calculated star voltage of the electric motor comprising the steps of:
      determining phase voltages to apply to the phases of the electric motor; and
      determining the sum of said phase voltages, said calculated star voltage being equal to one-third of said sum of said phase voltages;
   determining a measured star voltage of the electric motor;
   comparing said calculated star voltage to said measured star voltage of the electric motor to determine a star voltage error; and
   determining the fault in the system when said star voltage error exceeds a predetermined maximum star voltage error.

2. The method as recited in claim 1, wherein the system is an electric assist steering system and the electric motor is an electric assist motor for providing steering assist torque for helping to steer steerable wheels of a vehicle, said step of determining phase voltages comprising the steps of:
   determining a required steering assist torque as a function of a sensed applied steering torque and a sensed vehicle speed; and
   determining said phase voltages as a function of said required steering assist torque and a sensed rotor position of the electric motor.

3. A method for determining a fault in a system including an electric motor, said method comprising the steps of:
   determining a calculated star voltage of the electric motor;
   determining a measured star voltage of the electric motor;
   comparing said calculated star voltage to said measured star voltage of the electric motor to determine a star voltage error by determining an absolute difference between said calculated star voltage and said measured star voltage; and
   determining the fault in the system when said star voltage error exceeds a predetermined maximum star voltage error.

4. Apparatus for determining a fault in a system including an electric motor, said apparatus comprising:
   means for determining a calculated star voltage of the electric motor comprising:
      means for determining phase voltages to apply to the phases of the electric motor; and
      means for determining the sum of said phase voltages, said calculated star voltage being equal to one-third of said sum of said phase voltages;
   means for determining a measured star voltage of the electric motor;
   means for comparing said calculated star voltage to said measured star voltage of the electric motor to determine a star voltage error; and
   means for determining the fault in the system when said star voltage error exceeds a predetermined maximum star voltage error.

5. The apparatus as recited in claim 4, wherein the system is an electric assist steering system and the electric motor is an electric assist motor for providing steering assist torque for helping to steer steerable wheels of a vehicle, said means for determining phase voltages comprising:
   means for determining a required steering assist torque as a function of a sensed applied steering torque and a sensed vehicle speed; and
   means for determining said phase voltages as a function of said required steering assist torque and a sensed rotor position of the electric motor.

6. Apparatus for determining a fault in a system including an electric motor, said apparatus comprising:
   means for determining a calculated star voltage of the electric motor comprising means for determining an absolute difference between said calculated star voltage and said measured star voltage;
   means for determining a measured star voltage of the electric motor;
   means for comparing said calculated star voltage to said measured star voltage of the electric motor to determine a star voltage error; and
   means for determining the fault in the system when said star voltage error exceeds a predetermined maximum star voltage error.

* * * * *